US009294092B2

(12) United States Patent
Hutton

(10) Patent No.: US 9,294,092 B2
(45) Date of Patent: Mar. 22, 2016

(54) ERROR RESILIENT PACKAGED COMPONENTS

(71) Applicant: Altera Corporation, San Jose, CA (US)

(72) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/952,398

(22) Filed: Jul. 26, 2013

(65) Prior Publication Data
US 2015/0028918 A1 Jan. 29, 2015

(51) Int. Cl.
H03K 19/003 (2006.01)
H03K 19/007 (2006.01)

(52) U.S. Cl.
CPC .................. H03K 19/0033 (2013.01)

(58) Field of Classification Search
None
See application file for complete search history.

(56) References Cited

U.S. PATENT DOCUMENTS

| 5,604,755 | A * | 2/1997 | Bertin et al. | 714/799 |
| 6,031,386 | A * | 2/2000 | Cole et al. | 324/762.02 |
| 6,137,167 | A * | 10/2000 | Ahn et al. | 257/691 |
| 7,509,541 | B2 * | 3/2009 | Minemier | 714/704 |
| 2012/0015480 | A1* | 1/2012 | Hughes et al. | 438/107 |
| 2014/0092939 | A1* | 4/2014 | Chang et al. | 374/178 |

FOREIGN PATENT DOCUMENTS

| CN | 102254871 | 11/2011 |
| CN | 103000625 | 3/2013 |

OTHER PUBLICATIONS

Morgan, et al., "SEU-induced persistent error propagation in FPGAs", IEEE Trans. Nucl. Sci., vol. 52, No. 6, pp. 2438-2445, 2005.
Ferron, J.B. et. al., "Analysis of Configuration bit criticality in designs implemented with SRAM-based FPGAs", pp. 83-88, IEEE Symposium on Industrial Electronics and Applications (ISIEA2011), Sep. 25-28, Langkawi, Malaysia.
Feng, et al., "IPR: In-Place Reconfiguration for FPGA Fault Tolerance", ICCAD 2009, Nov. 1-4, San Jose, California, USA.
Feng, et al., "IPF: In-place X-Filing to Mitigate Soft Errors in SRAM-based FPGAs", pp. 482-485, International Conference on Field Programmable Logic and Applications (FPL), Sep. 2011.

(Continued)

Primary Examiner — Jany Richardson
(74) Attorney, Agent, or Firm — Jason Tsai

(57) ABSTRACT

A packaged component may include an interposer and integrated circuit dies mounted on the interposer. At least one of the dies may be a radiation-hardened integrated circuit die, whereas the remaining dies may be non-radiation-hardened dies. If desired, the interposer may be a radiation-hardened interposer whereas the integrated circuit dies may be non-radiation-hardened dies. The radiation-hardened die or the radiation-hardened interposer may include monitor circuitry that is used to test non-radiation-hardened circuitry of the packaged component. Test results may be stored in a database at the monitor circuitry or transmitted to external devices such as a server. The monitor circuitry may be used to reconfigure failed circuitry or may control multiplexing circuitry in the interposer to functionally replace the failed circuitry. If desired, the monitor circuitry may adjust power consumption of non-radiation-hardened circuitry based on the test results.

19 Claims, 14 Drawing Sheets

(56) References Cited

OTHER PUBLICATIONS

Jing, et al., "Mitigating FPGA Interconnect Soft Errors by In-Place LUT Inversion," ICCAD 2011 pp. 582-586.

Jing, et al., "Quantitative SEU Fault Evaluation for SRAM-Based FPGA Architectures and Synthesis Algorithms," International Conference on Field Programmable Logic and Applications (FPL) 2011, pp. 282-285.

* cited by examiner

US 9,294,092 B2

ERROR RESILIENT PACKAGED COMPONENTS

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

Integrated circuits such as programmable integrated circuits and dedicated integrated circuits can be susceptible to temporary errors such as those caused by background radiation. For example, a charged particle in the environment that impacts circuitry on an integrated circuit can cause temporary malfunction of the circuitry (e.g., a flipped storage bit, a glitch on a signal path, etc.). Such temporary errors are sometimes referred to as soft errors or single event upsets (SEUs). Soft errors can be particularly disruptive for programmable integrated circuits. For example, configuration data loaded into a programmable integrated circuit may be corrupted by soft errors.

Circuitry such as transistors often degrade in performance and reliability over time in a process referred to as aging. Degradation over time may be caused by stress of transistors being held in on-states for extended periods of time or the frequency to which transistors are switched (as examples).

Techniques for improving the resiliency of an integrated circuit chip against soft errors include physical hardening of the chip (e.g., by using a radiation-resistant manufacturing or fabrication process) and logical hardening of the chip (e.g., by introducing redundancy and error correction). However, radiation hardening incurs significant cost to each radiation-hardened chip. For example, improving radiation resiliency by a factor of two may incur a die area cost of five percent or more. As another example, improving radiation resiliency by a factor of ten may increase per-device cost by thirty to forty percent. Resiliency may also be improved by periodically testing and repairing configuration data of a programmable integrated circuit.

With continuing migration to smaller process geometries, integrated circuit capacities continue to increase (e.g., the number of transistors and other circuit elements in each device increases). With increased integrated circuit capacities, the probability of device failure due to soft errors increases. However, improving the resiliency of devices to satisfactory levels may incur unacceptable amounts of cost. It would therefore be desirable to provide electronic devices with improved radiation resiliency.

SUMMARY

A packaged component may include an interposer and at least first and second circuits on the interposer. The first circuit may be a non-radiation-hardened integrated circuit die mounted on the interposer. If desired, additional integrated circuit dies may be mounted on the interposer. The first and second circuits may be characterized by a reliability metric such as failure-in-time (FIT). The second circuit may be characterized by a reliability metric value that is less than the reliability metric value of the first circuit such that the second circuit is more reliable than the first circuit. The second circuit may be a radiation-hardened circuit such as a radiation-hardened integrated circuit die mounted on the interposer or radiation-hardened circuitry within the interposer. Radiation-hardened circuits are physically and/or logically structured to provide increased resiliency against transient errors due to ionizing radiation (e.g., neutron particles, alpha particles, etc.). Radiation-hardened circuits may sometimes be referred to herein as being single-event upset (SEU) resistant, because the radiation-hardened circuits are resistant to single-event upset errors. The first and second circuits may be programmable integrated circuits or dedicated integrated circuits.

The radiation-hardened second circuit of the packaged component may include monitor circuitry that is electrically coupled to the first circuit by paths on the interposer. The monitor circuitry may perform tests to monitor the performance and/or temperature of non-radiation-hardened circuits of the packaged component such as the first circuit. Test results may be stored in a database at the monitor circuitry or transmitted to external devices such as a network server. In the scenario that the first circuit is a programmable circuit, the monitor circuitry may configure the first circuit with a test configuration such as a ring oscillator test configuration or a launch-and-capture test configuration and use the test configuration in testing the first circuit. In response to determining that the first circuit fails testing, the monitor circuitry may program the first circuit with an alternate configuration that utilizes different programmable portions of the first circuit than the previous configuration of the first circuit.

The interposer may be an active interposer that includes active circuitry. The active interposer may include first and second trace buffers that store output signals from the first circuit and the monitor circuitry, respectively. During test operations, the monitor circuitry may be programmed with the configuration of the first circuit. For example, the monitor circuitry may include a control portion that configures a programmable portion of the monitor circuitry with the configuration of the first circuit. The trace buffers may be subsequently used to store data produced by the monitor circuitry and the first circuit. The data stored in the trace buffers may be compared by the monitor circuitry to determine whether the first circuit has failed. In response to determining that the first circuit fails testing, the monitor circuitry may configure input and output multiplexing circuitry on the active interposer to functionally replace the first circuit with the monitor circuitry.

Further features of the present invention, its nature and various advantages will be more apparent from the accompanying drawings and the following detailed description.

DETAILED DESCRIPTION

Embodiments of the present invention relate to resiliency of circuitry against soft errors such as errors caused by radiation and against stress-related failures. The circuitry may include programmable integrated circuits, dedicated integrated circuits, or other types of integrated circuits.

Figure 1:
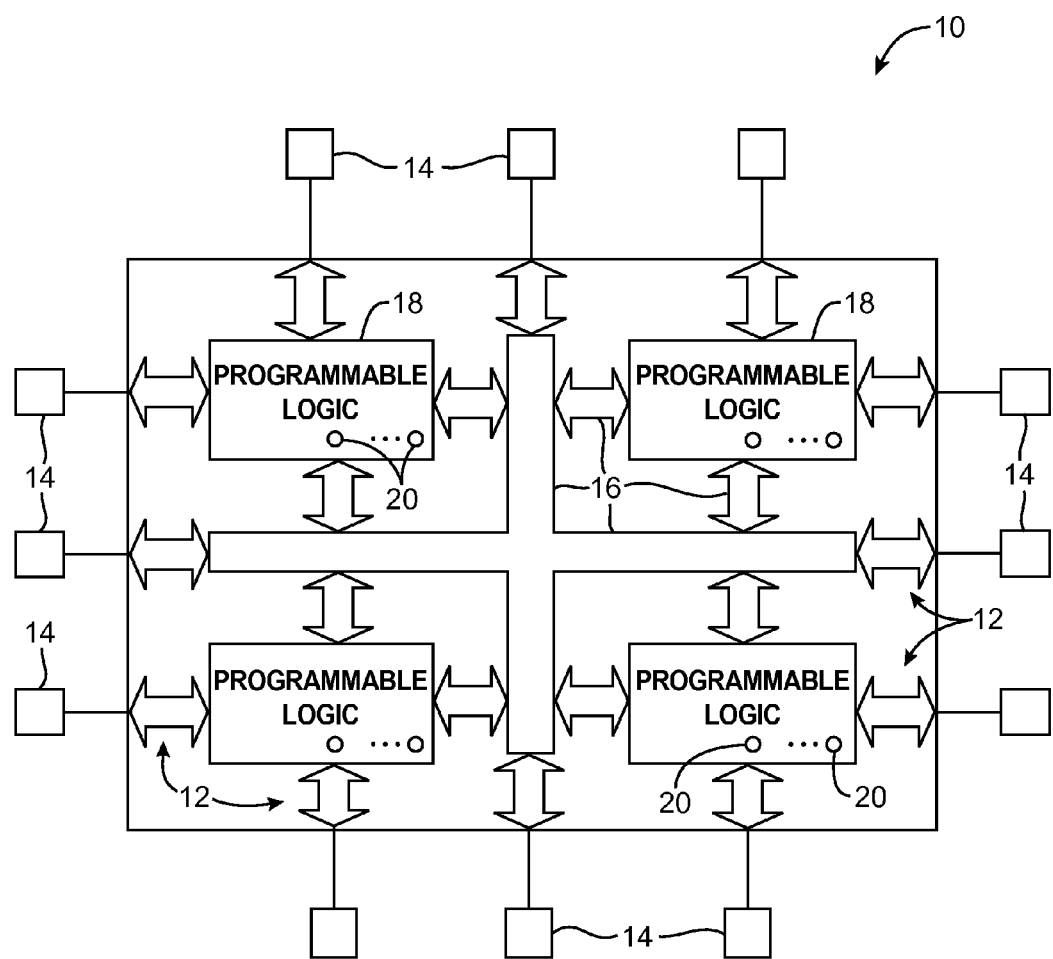
FIG. 1 is a diagram of an illustrative programmable integrated circuit in accordance with an embodiment of the present invention.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources.

Programmable logic regions 18 may include combinational and sequential logic circuitry. For example, programmable logic regions 18 may include look-up tables, registers, and multiplexers. Programmable logic regions 18 may be configured to perform a custom logic function.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
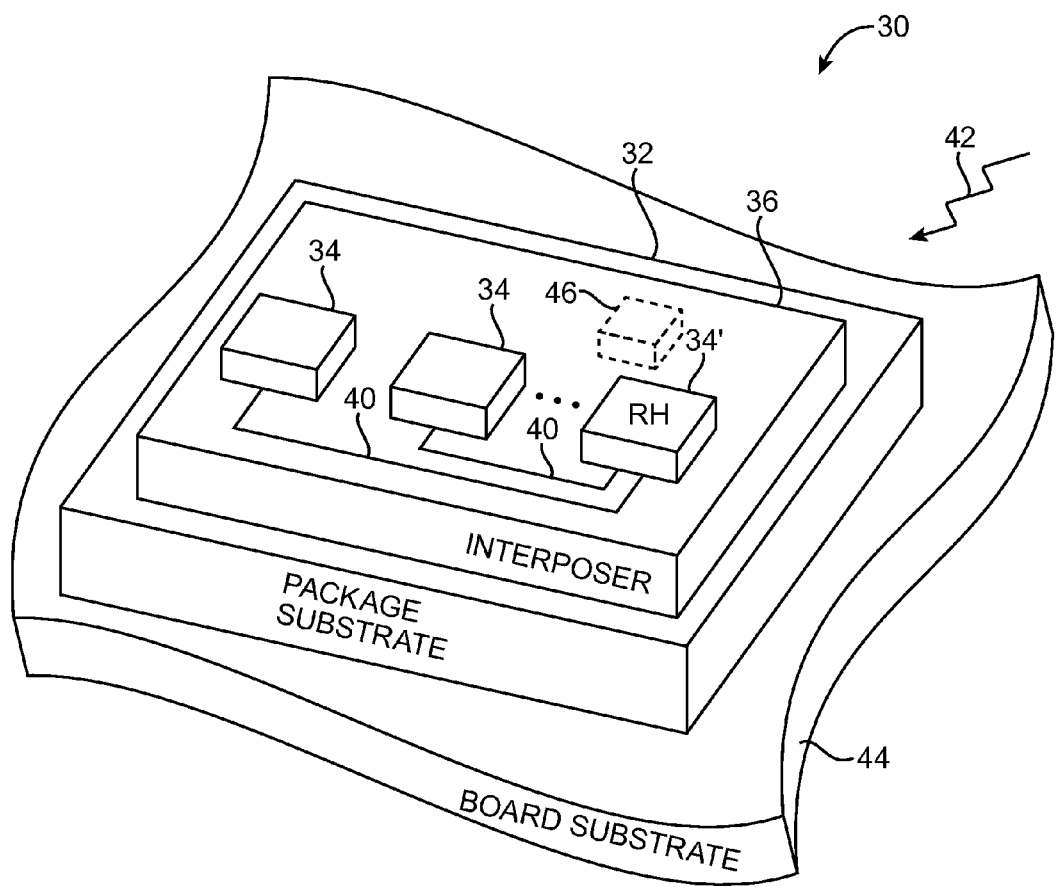
FIG. 2 is a perspective view of a packaged component including non-radiation-hardened and radiation-hardened integrated circuit dies mounted on an interposer in accordance with an embodiment of the present invention.

Multiple integrated circuits such as device 10 may be combined in a packaged device 30 as shown in FIG. 2. Packaged device 30 may include integrated circuits 34 and 34' that are mounted to interposer 36. Integrated circuits 34 and 34' may be individual integrated circuit dies (chips) that are mounted to interposer 36 via solder bumps such as microbumps. Integrated circuit dies 34 and 34' may be mounted to interposer 36 using flip-chip mounting processes or any desired techniques. Interposer 36 may be mounted on a package substrate 32 via solder bumps.

Integrated circuits that are mounted to interposer 36 may communicate over paths in the interposer such as paths 40. Interposer 36 may include multiple metal layers over an interposer substrate that are patterned to form traces. Communications paths 40 may be formed from traces on one or more metal layers of the interposer.

Integrated circuits 34 and 34' may be programmable integrated circuits such as circuit 10 of FIG. 1, dedicated integrated circuits such as application-specific integrated circuits, memory circuits such as static or dynamic random access memory, or any desired integrated circuit. Interposer 36 that includes only passive elements such as routing paths 40 may sometimes be referred to as a passive interposer (e.g., because passive interposer 36 merely conveys signals for integrated circuit dies). If desired, interposer 36 may include optional circuitry 46. Circuitry 46 may include active circuitry such as transistors or other switching elements that can be used to process or generate signals. In this scenario, interposer 36 may be referred to as an active interposer, because active interposer 36 includes active circuitry such as circuitry 46.

The arrangement of FIG. 2 in which multiple integrated circuits are mounted to an interposer may sometimes be referred to as a 2.5-dimensional ("2.5D") package. If desired, other arrangements such as so-called three-dimensional ("3D") package configurations may be used. In, 3D package configurations, multiple integrated circuit dies are stacked on each other and communications paths may be formed through the substrates of the integrated circuit dies (e.g., instead of paths formed in an interposer). If desired, 2.5D and 3D package configurations may be combined. For example, multiple integrated circuit dies 34 may be stacked using 3D packaging techniques and may be mounted on an interposer along with additional integrated circuit dies.

During normal operation, device 30 may be exposed to radiation such as radiation 42. Radiation 42 may be background radiation such as ionized particles or cosmic rays received from space. Radiation 42 that strikes circuitry such as circuits 34 on device 30 may cause soft errors such as single event upsets (SEUs).

Integrated circuit dies 34 may be designed and/or manufactured with desired levels of radiation resiliency. In the example of FIG. 2, integrated circuit 34' may be a radiation-hardened die (e.g., SEU resistant), whereas integrated circuits 34 may be provided without radiation hardening (or with reduced levels of radiation resiliency). Integrated circuit 34' may be radiation-hardened using physical and/or logical radiation hardening techniques. For example, integrated circuit 34' may utilize radiation-hardened flash-based programmable elements, whereas integrated circuits 34 may utilize static random access memory (SRAM) based programmable elements. Physical radiation-hardened integrated circuits may be formed on insulating substrates such as silicon oxides or sapphire or may be implemented using radiation-hardened circuitry such as magneto-resistive memory that is resistant to radiation.

Integrated circuits may be characterized by reliability metrics such as the number of failures-in-time (FIT). The number of failures-in-time may sometimes be referred to as the soft error rate (SER) or the failure-in-time metric. The failure-in-time metric is defined as the number of device failures (e.g., estimated failures) over a predetermined length or period of time (e.g., $10^9$ hours of operation). This example is merely illustrative. If desired, any reliability metric such as mean time between failures (MTBF) may be used in characterizing integrated circuits. Radiation-hardened integrated circuits may have a failure-in-time metric value that is substantially less than non-radiation-hardened integrated circuits. For example, non-radiation-hardened integrated circuits may have a failure-in-time metric value that is ten times greater (or more) than the failure-in-time metric value of radiation-hardened integrated circuits.

Radiation-hardening may be provided to integrated circuits that are more vulnerable to soft errors. Consider the scenario in which integrated circuits 34 implement data paths that are controlled via control functions performed by integrated circuit 34'. In this scenario, integrated circuit 34' may control communications protocols that are used to communicate over data paths implemented by integrated circuits 34. The communications protocols may include integral redundancy schemes such as error-checking at communications source and destinations. In this scenario, ensuring that control operations of integrated circuit 34' are error-free may be more critical than protecting data communications operations of integrated circuits 34 (e.g., because errors in control operations may result in failure of device 30, whereas errors in data transmissions results only in data errors and may potentially be recovered or identified by error-checking).

The example of FIG. 2 in which integrated circuit 34' is radiation-hardened whereas integrated circuits 34 are not radiation-hardened is merely illustrative. If desired, any desired number of integrated circuit dies 34 may be radiation-hardened or non-radiation-hardened. For example, two or more integrated circuit dies on interposer 36 may be radiation-hardened, whereas remaining integrated circuit dies may be non-radiation-hardened. Integrated circuit 34' may have similar or different resources as integrated circuits 34. Integrated circuit 34' may perform similar functions as integrated circuits 34 or may perform different functions.

Figure 3:
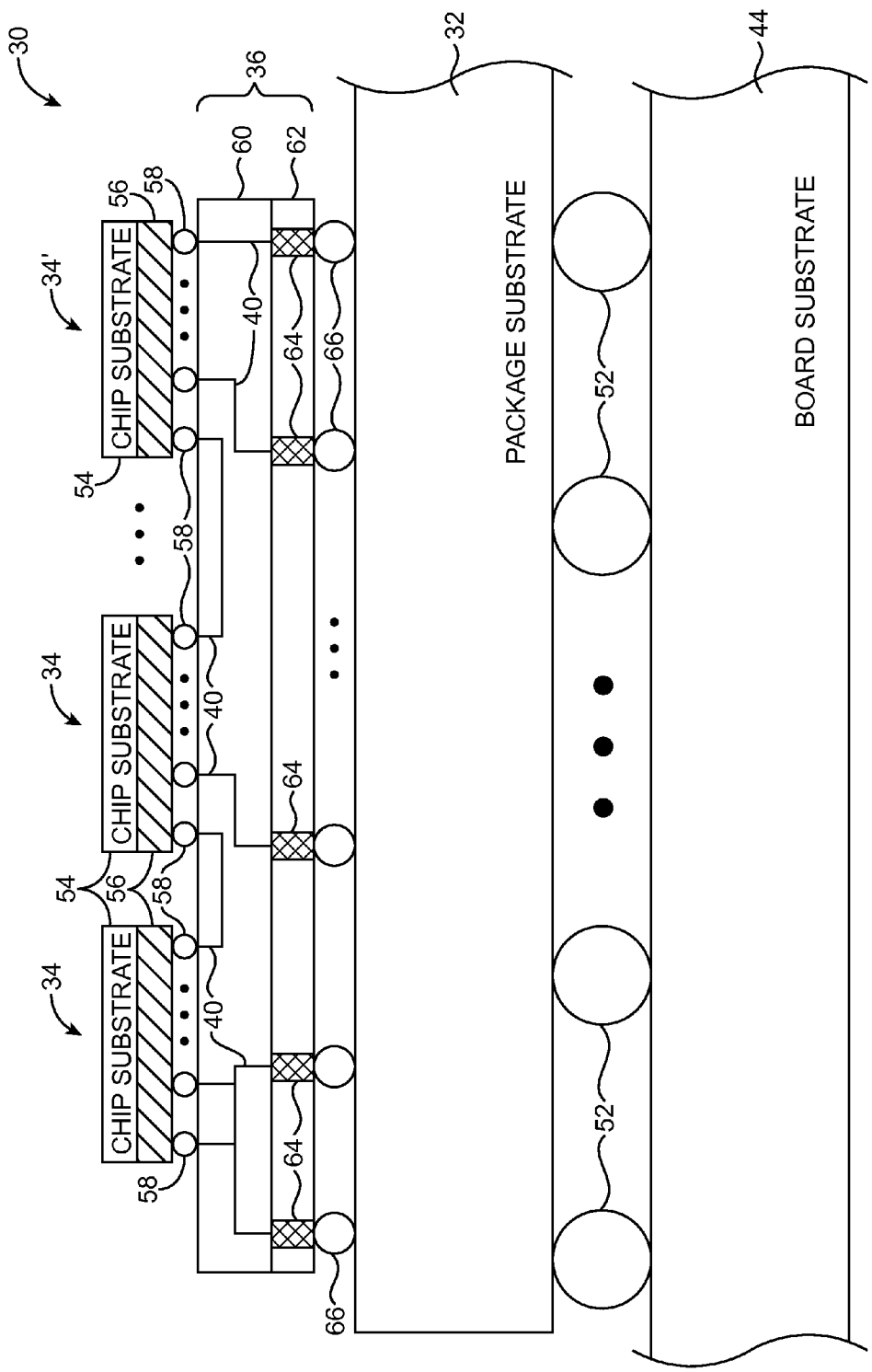
FIG. 3 is a cross-sectional side view of a packaged component including non-radiation-hardened and radiation-hardened integrated circuit dies mounted on an interposer in accordance with an embodiment of the present invention.

FIG. 3 is an illustrative cross-sectional side view of device 30. As shown in FIG. 3, multichip package 30 may include package substrate 32, interposer 36 mounted on package substrate 32, and multiple dies mounted on top of interposer 36. Integrated circuit dies 34 and 34' may be mounted laterally on the top surface of interposer 36, whereas the bottom surface of interposer 36 may be mounted to package substrate 32.

Packaged component 30 may be mounted to board substrate 44. Package substrate 32 may be coupled to board substrate 44 via solder balls 52. As an example, solder balls 52 may form a ball grid array (BGA) configuration for interfacing with corresponding conductive pads on board substrate 44. Substrate 44 may be a printed circuit board (PCB) on which multichip package 30 and other single-chip or multichip packages may be mounted.

Each integrated circuit die (e.g., dies 34 and 34') may include a chip substrate 54 and interconnect layers 56 on the chip substrate. Substrate 54 may, for example be a silicon substrate or may be formed from any desired materials. Circuit structures such as transistor gate structures may be formed at the surface of chip substrate 54 that faces interconnect layers 56. In other words, the circuit structures may be formed at the interface between chip substrate 34 and interconnect layers 56.

Interconnect layers 56 (sometimes referred to collectively as a dielectric stack) may include alternating layers of metal routing layers (e.g., dielectric layers in which metal routing paths can be formed) and via layers (e.g., dielectric layers through which metal vias can be formed for electrically connecting paths from one metal routing layer to paths in another metal routing layer such as an adjacent metal routing layer). This example is merely illustrative. Metal routing layers may include routing paths formed from any desired conductive materials. Interconnect stack 56 may include eight metal routing layers or any desired number of metal routing layers.

Interconnect layers 56 may include surface contact pads (e.g., microbump pads) that are coupled to microbumps 58. The surface contact pads may be formed on the uppermost layer of interconnect stack 56 (e.g., an interconnect layer on a surface opposite to the interface between chip substrate 54 and interconnect layers 56). Microbumps 58 may refer to solder bumps that are formed on the uppermost layer of interconnect stack 56. For example, microbumps 58 may be deposited on microbump pads formed in the uppermost layer of interconnect stack 56 (facing interposer 36). Microbumps 58 may have a diameter of 10 um (as an example). Integrated circuit chips 34 may be electrically coupled to interposer 36 via microbumps 58. The microbumps may be used to convey signals between integrated circuits 34 and interposer 36.

The arrangement of FIG. 3 in which integrated circuit dies 34 and 34' are mounted to interposer 36 with interconnect layers 56 facing interposer 36 may sometimes be referred to as a flip-chip configuration, because each die is inverted/flipped from its conventional upright arrangement in which the die is mounted with chip substrate 54 facing an underlying package or board substrate.

Interposer 36 may include interposer substrate 62 and interconnect layers 60 over substrate 62. Interposer substrate 62 may be a semiconductor substrate such as silicon. Interconnect layers 60 may include alternating metal routing layers similar to interconnect stack 56. Routing paths 40 may be formed in the metal routing layers of interconnect stack 60. Routing paths 40 may convey signals between integrated circuit dies, between integrated circuit dies and package substrate 32, or between portions of interposer 36.

Interposer 36 may be a passive interposer that includes only metal routing layers and other passive elements (e.g., resistors, capacitors, and inductors). If desired, interposer 36 may be an active interposer that includes active circuitry such as transistors. Circuitry such as transistors may be formed in interposer substrate 62 at the interface between interconnect stack 60 and interposer substrate 62.

Interposer 36 may include conductive vias 64 formed in interposer substrate 62. Vias 64 may extend between upper and lower surfaces of interposer substrate 62. In scenarios such as when interposer substrate 62 is formed from silicon, vias 64 may be referred to as through-silicon vias. Conductive vias 64 may be formed from metal or any desired conductive materials and may serve to convey signals from interposer 36 to underlying package substrate 32. Routing paths 40 may include conductive vias 64.

Interposer 36 may be coupled to package substrate 32 via solder balls 66 (sometimes referred to as solder bumps). Solder balls 66 that interface directly with package substrate 32 may sometimes be referred to as controlled collapse chip connection ("C4") bumps and may each have a diameter of 100 um (as an example). In general, solder balls 52 that are used for interfacing with package substrate 32 are substantially larger in size than microbumps 58 (e.g., microbumps used for interfacing between integrated circuit dies and interposer 36). The number of microbumps 58 is typically substantially greater than the number of solder balls 52 (e.g., the ratio of the number of microbumps to the number of interposer-to-substrate solder balls 66 may be greater than 2:1, 5:1, 10:1, etc.).

Integrated circuit dies 34 and 34' may be fabricated individually using similar or different processes. For example, integrated circuit dies 34 may be fabricated using a first fabrication process, whereas integrated circuit die 34' may be fabricated using a second, different fabrication process that produces radiation-hardened circuitry. This example is merely illustrative. The fabrication processes used to manufacture integrated circuit dies and radiation-hardened dies may be similar. For example, integrated circuit die 34' may be radiation-hardened using logical circuit structures implemented as part of the circuitry on die 34'. In this scenario, similar fabrication processes may be used to manufacture integrated circuit dies 34 and radiation-hardened die 34'.

Figure 4:
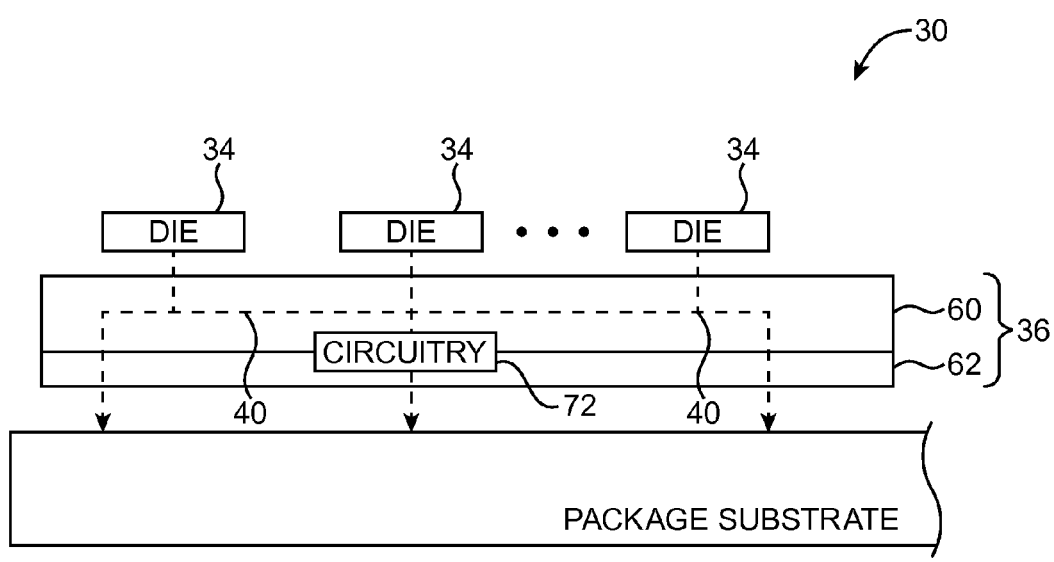
FIG. 4 is a cross-sectional side view of a packaged component including integrated circuit dies mounted on an interposer having radiation-hardened circuitry in accordance with an embodiment of the present invention.

The example of FIG. 3 in which one or more selected integrated circuit dies are radiation-hardened is merely illustrative. If desired, any portion of the circuitry of package 30 may be radiation-hardened. FIG. 4 is an illustrative cross-sectional side view of an integrated circuit package 30 in which circuitry of interposer 36 may be radiation-hardened. In the example of FIG. 4, integrated circuits 34 that are mounted to interposer 36 may be fabricated without radiation-hardening (or with a reduced level of radiation-hardening). Integrated circuits 34 may be mounted to interposer 36, which may be mounted to package substrate 32 similarly to FIG. 3 (e.g., via solder balls).

Interposer 36 of FIG. 4 includes active circuitry 72 such as transistors. Active circuitry 72 may perform any desired function. For example, circuitry 72 may be processing circuitry, storage circuitry, monitoring circuitry, or circuitry performing other functions. Interposer 36 may be radiation-hardened using techniques similar to those used in hardening integrated circuit 34' against radiation (e.g., physical and/or logical radiation hardening). For example, functional blocks on circuitry 72 may be replicated to form voting groups in which the outputs of each functional block of a group are used in determining the output of that group. As another example, radiation-hardened interposer 36 may be fabricated using physical radiation-hardening processes.

Integrated circuit dies 34 may communicate with radiation-hardened circuitry 72 and other integrated circuit dies via paths 40 of interposer 36. Paths 40 may be formed similarly to FIG. 3. For example, paths 40 may include metal interconnect paths and vias in alternating metal layers and may include solder balls and through-silicon vias.

The examples of FIG. 3 and FIG. 4 in which integrated circuit die 34' or interposer circuitry 72 is radiation-hardened are merely illustrative. If desired, any selected portion of integrated circuit dies and interposer circuitry may be radiation-hardened. For example, two or more integrated circuit dies on interposer 36 may be radiation-hardened. As another example, interposer 36 and one or more integrated circuit dies mounted on interposer 36 may be radiation-hardened.

Figure 5:
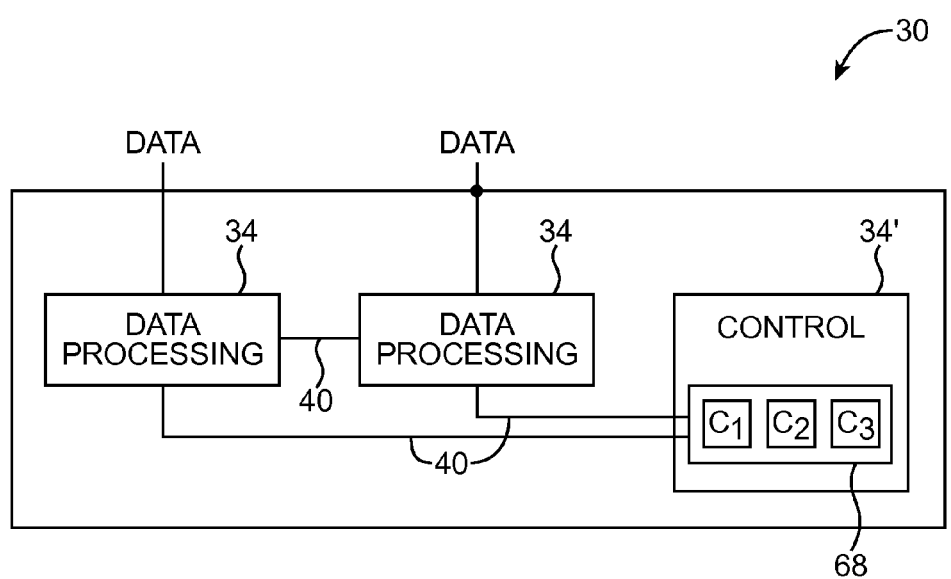
FIG. 5 is a diagram of an illustrative packaged component including data processing and control circuits in accordance with an embodiment of the present invention.

Portions of packaged component 30 may be selectively radiation-hardened based on how vulnerable the packaged component portions are to temporary errors such as soft errors. FIG. 5 is an illustrative block diagram of a packaged component having portions that are radiation-hardened. In the example of FIG. 5, packaged component 30 may serve as a communications device (e.g., a network switching circuit). Integrated circuit dies 34 may be used to implement data processing circuits that receive and forward data using a communications protocol. Radiation-hardened integrated circuit die 34' may be used to implement control circuitry that controls the data processing circuits according to the communications protocol.

Soft errors that occur during operation of control circuitry 34' may cause errors in the operation of the entire device, because control circuitry 34' controls the functions of data processing circuits 34. In contrast, data processing circuits are merely responsible for processing incoming and outgoing data. Soft errors in the operation of data processing circuits typically only result in data transmission errors and not in device failure. In some scenarios, communications protocols implement inherent error checking that helps to prevent or reduce the impact of data errors. Data processing circuits 34 that communicate using such protocols are less vulnerable to soft errors, because data errors resulting from soft errors may be handled by error checking of the communications protocols.

In the example of FIG. 5, radiation-hardened integrated circuit die 34' may be implemented using a logical radiation-hardening technique in which functional circuit blocks C1, C2, and C3 form a voting group 68. Each functional block may perform identical functions (e.g., blocks C2 and C3 may be duplicates of block C1). Functional blocks C1, C2, and C3 may vote to determine what control signals are to be provided to data processing circuits 34 over paths 40. Functional blocks C1, C2, and C3 provide logical redundancy and resiliency against soft errors, because the probability of soft errors at multiple functional blocks is lower than the probability of a soft error at a single functional block.

Use of an interposer such as interposer 36 of FIG. 3 allows for selective radiation-hardening of portions of packaged component 30. Critical circuitry that is vulnerable to soft errors such as control circuitry may be consolidated and implemented using one or more selected integrated circuit dies that are radiation-hardened, whereas circuitry that is less critical or less vulnerable to soft errors such as data path circuitry may be implemented using one or more normal, non-radiation-hardened integrated circuits.

Figure 6:
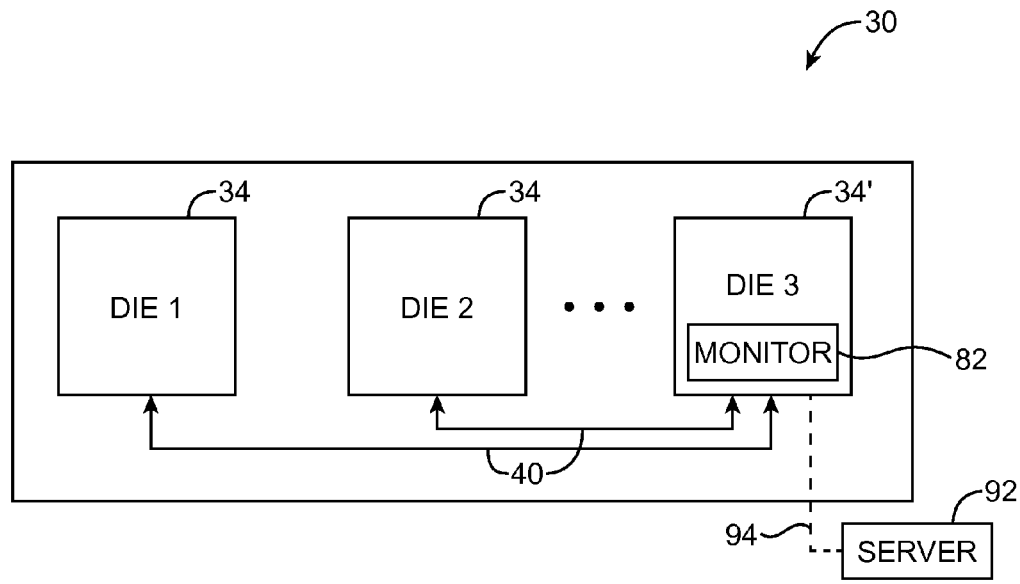
FIG. 6 is a diagram of an illustrative packaged component including radiation-hardened monitor circuitry in accordance with an embodiment of the present invention.

The radiation-hardened portions of package component 30 may be used to implement error-checking, monitoring, and other functions for improving the resiliency of non-radiation-hardened portions against soft errors. By using radiation-hardened portions of package component 30 to implement error checking, the overall resiliency of package component 30 may be improved. FIG. 6 is an illustrative block diagram of a packaged component 30 having radiation-hardened monitor circuitry 82.

As shown in FIG. 6, packaged component 30 may include integrated circuit dies 34 and 34'. Integrated circuit die 34' may be fabricated using radiation-hardening techniques and may be used to implement monitor circuitry 82. Radiation-hardened monitor circuitry 82 may communicate with non-hardened circuitry 34 over paths 40 (e.g., paths in an underlying interposer). Monitor circuitry 82 may passively or actively monitor other attributes of integrated circuit dies 34. The monitored attributes may include error rates such as bit-error rates, operating temperatures such as junction temperatures, or other performance characterizations. The monitored attributes may be used to identify stress conditions that are indicative of current or future device failures (e.g., permanent failures associated with transistor stress or other circuit degradation over time). Monitor circuitry 82 may sometimes be referred to as a health monitor or a performance monitor, because circuitry 82 monitors the health and/or performance of package 30 over time.

Optionally, monitor circuitry 82 may communicate with remote computing equipment such as server 92 over paths 94. Paths 94 may include paths through an interposer, a package substrate, and external paths such as paths through a board substrate, cables, etc. Monitor circuitry may communicate with server 92 using any desired communications protocols (e.g., network protocols such as Ethernet, local bus protocols, etc.). For example, monitor circuitry 82 may send monitored attributes to server 92 that are used in identifying future device failures.

Figure 7:
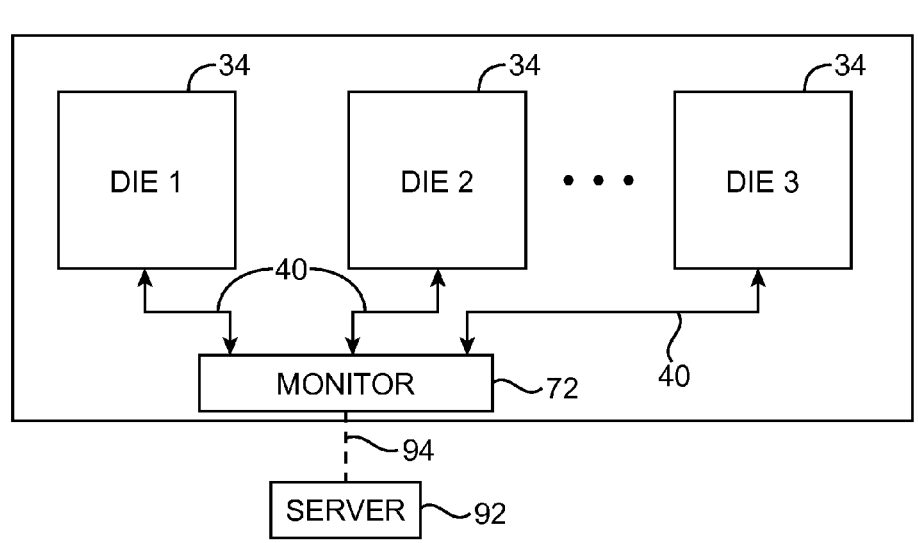
FIG. 7 is a diagram of an illustrative packaged component including radiation-hardened monitor circuitry formed as part of an interposer in accordance with an embodiment of the present invention.

The example of FIG. 6 in which monitor circuitry 82 is implemented using a radiation-hardened integrated circuit die is merely illustrative. Monitor circuitry 82 may be implemented using one or more radiation-hardened integrated circuit dies (e.g., monitor circuitry may be implemented on multiple integrated circuit dies). If desired, monitor circuitry may be implemented using radiation-hardened circuitry external to integrated circuit dies 34 as shown in FIG. 7. In the example of FIG. 7, monitor circuitry may be implemented using active circuitry 72 of an interposer such as interposer 36 on which integrated circuit dies 34 are mounted. Monitor circuitry 72 may communicate with and monitor integrated circuit die 34 via paths 40 and may communicate with optional server 92 similarly to monitor circuitry 82 of FIG. 6.

Figure 8:
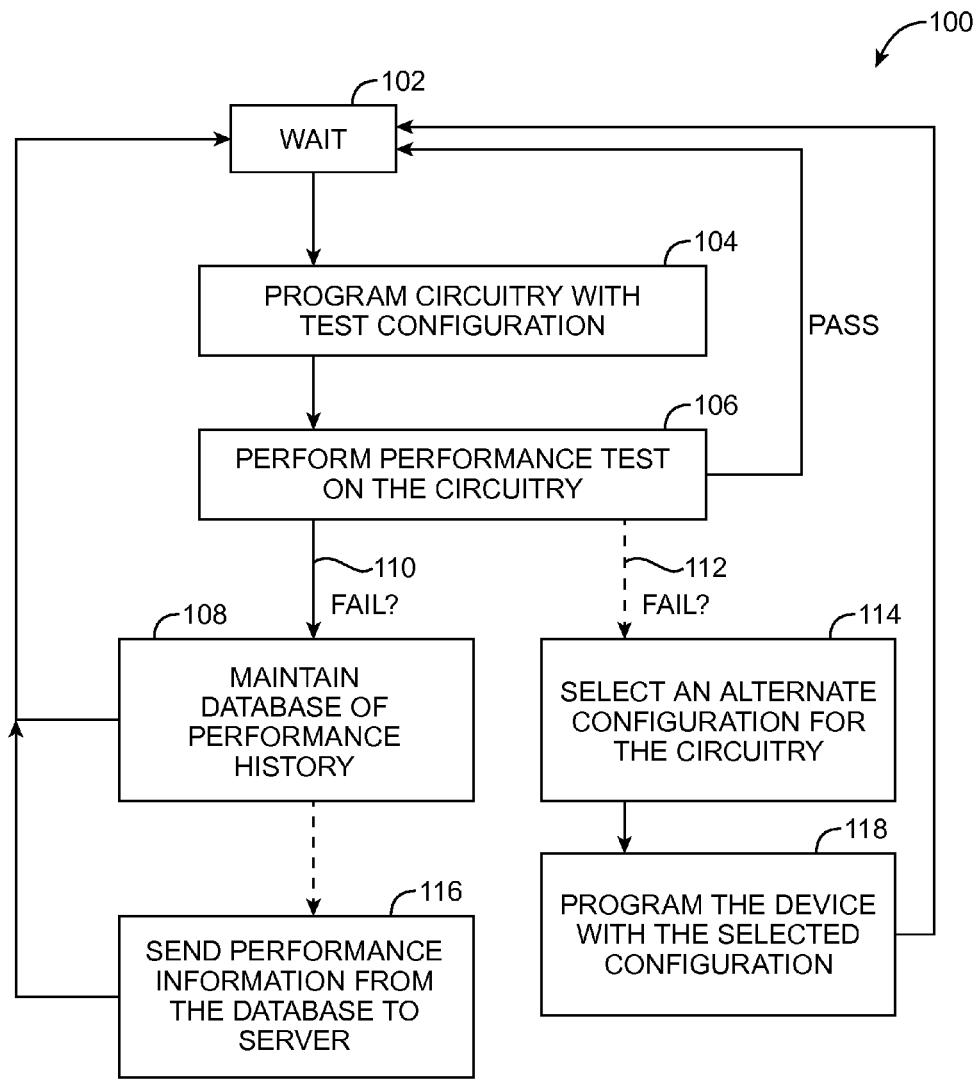
FIG. 8 is a flow chart of illustrative steps that may be performed by radiation-hardened monitor circuitry to test other circuitry in accordance with an embodiment of the present invention.

The performance of circuitry on package 30 often degrades over time in a process often referred to as aging. For example, transistors that are heavily used throughout the lifetime of package 30 (e.g., enabled for long periods of time) degrade in performance and reliability, whereas transistors that are less frequently enabled are more likely to maintain their original performance levels. FIG. 8 is a flow chart 100 of illustrative steps that may be performed by monitor circuitry to actively monitor the performance of other circuitry in a device such as package 30. In the example of FIG. 8, the circuitry to be tested may be programmable circuitry such as programmable integrated circuit 10 of FIG. 1 or portions of programmable integrated circuit 10 such as programmable logic regions. The operations of flow chart 100 may, as an example, be performed by monitor circuitry 82 of an integrated circuit die (FIG. 6) or monitor circuitry 72 of an interposer (FIG. 7).

During the operations of initial step 102, the monitor circuitry may wait in an idle state. For example, the monitor circuitry may be configured to perform active monitoring at periodic intervals of time. Time intervals may be configured in units of milliseconds, seconds, hours, days, etc. As another example, the monitor circuitry may receive external control input such as from other circuitry or from remote computing equipment that directs the monitor circuitry to initiate a performance test. In response to control input or expiration of a time interval, a performance test may be initiated by the monitor circuitry.

During step 104, the monitor circuitry may program the circuitry to be tested with a test configuration that is to be used for performance testing. The test configuration may sometime be referred to as a health monitor configuration. As an example, the monitor circuitry may load configuration bits into programmable elements that program the circuitry with the test configuration. The health monitor configuration may replace the current configuration of the circuitry. The use of programmable integrated circuits allows the monitor circuitry to load any desired test configuration and allows for a variety of performance tests.

During step 106, the monitor circuitry may perform a performance test on the circuitry to be tested. The monitor circuitry may, for example, measure or otherwise identify delay between circuit elements such as registers of the health monitor test configuration. As another example, the monitor circuitry may identify operating temperature or identify error rates such as bit error rates. The process may subsequently proceed to step 108 via path 110. If desired, the process may proceed to optional step 114 via optional path 112. Optional step 114 may be performed in addition to step 108 or in place of step 108.

During the operations of step 108, the monitor circuitry may maintain a database of performance history based on the results of the performance test during step 106. For example, measured delay values or other measured characteristics such as bit error rates or operating temperature may be processed and stored in the database. The database may be stored at storage circuitry in monitor 82. If desired, the results of the performance test may be stored at a remote database. Consider the scenario in which the device communicates with remote computing equipment such as a server. In this scenario, the operations of optional step 116 may be performed to send performance information on the device to the server. The server may process the performance information to determine whether maintenance operations such as re-writing configuration data (e.g., scrubbing), loading alternate configuration data, power management operations (e.g., adjusting power supply voltage), or other maintenance operations should be performed on the circuitry under test.

Optional step 114 may be performed in scenarios such as when the circuitry under test is implemented using programmable circuitry. For example, the circuitry under test may be programmable logic regions on a programmable integrated circuit die that have been configured to perform desired functions. During optional step 114, the monitor circuitry may select an alternate configuration for the programmable integrated circuit die. The alternate configuration may perform substantially identical functions as the original configuration of the circuitry under test while utilizing different portions of programmable circuitry on the programmable integrated circuit die. During subsequent step 118, the monitor circuitry may configure the programmable integrated circuit die with the selected configuration and the process may return to step 102.

Figure 9:
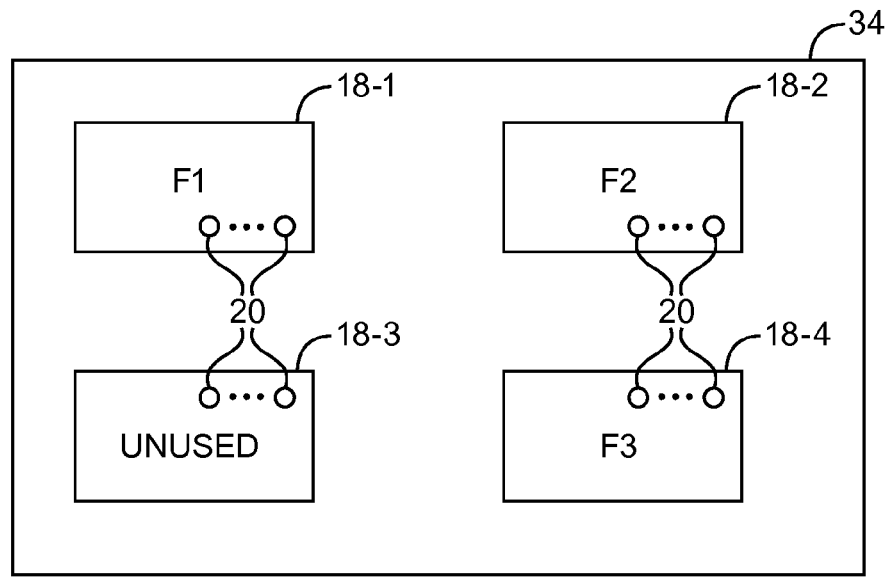
FIG. 9 is a diagram of an illustrative programmable integrated circuit having a first configuration in accordance with an embodiment of the present invention.
Figure 10:
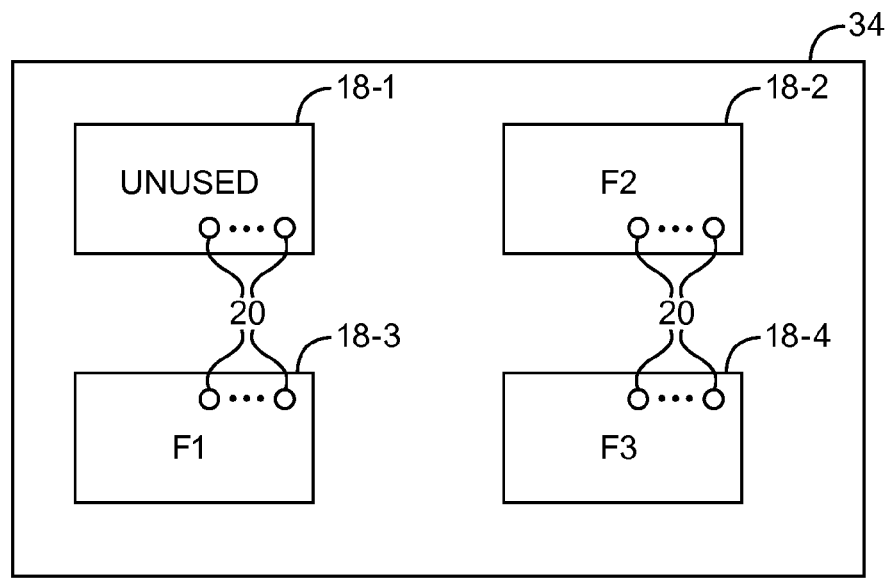
FIG. 10 is a diagram of an illustrative programmable integrated circuit having a second configuration that utilizes different logic regions than the first configuration of FIG. 9 in accordance with an embodiment of the present invention.

FIGS. 9 and 10 are illustrative diagrams showing how programmable logic circuitry may be configured with alternate configurations (e.g., during steps 114 and 118 of flow chart 100 of FIG. 8). In the examples of FIGS. 9 and 10, programmable integrated circuit 34 includes programmable logic regions 18-1, 18-2, 18-3, and 18-4.

In the example of FIG. 9, integrated circuit die 34 may be programmed in a first configuration in which logic functions F1, F2, and F3 are performed. Functions F1, F2, and F3 may be any desired functions such as those used in data storage and processing, communications, etc. In the configuration of FIG. 9, programmable logic regions 18-1, 18-2, and 18-4 may be configured to perform logic functions F1, F2, and F3, respectively. Each programmable logic region may be configured to perform a corresponding logic function by loading appropriate configuration data into programmable elements 20 of that programmable logic region. Logic functions F1, F2, and F3 may only require only three programmable logic regions to implement, and therefore logic region 18-3 may be unused in the first configuration.

With operational use and stress, circuitry such as transistors in programmable logic regions 18-1, 18-2, and 18-4 may degrade in performance. However, unused programmable logic region 18-3 may maintain original performance levels which exceed the degraded performance levels of regions 18-1, 18-2, and 18-4. The first configuration (FIG. 9) may be swapped with a second, alternate configuration such as shown in FIG. 10. In the second configuration of FIG. 10, logic functions F1, F2, and F3 may be implemented using programmable logic regions 18-3, 18-2, and 18-4, respectively. Rotating which logic region is unused may help to maintain the overall performance levels of device 34, as transistor stress is more balanced among the programmable logic regions.

Figure 11:
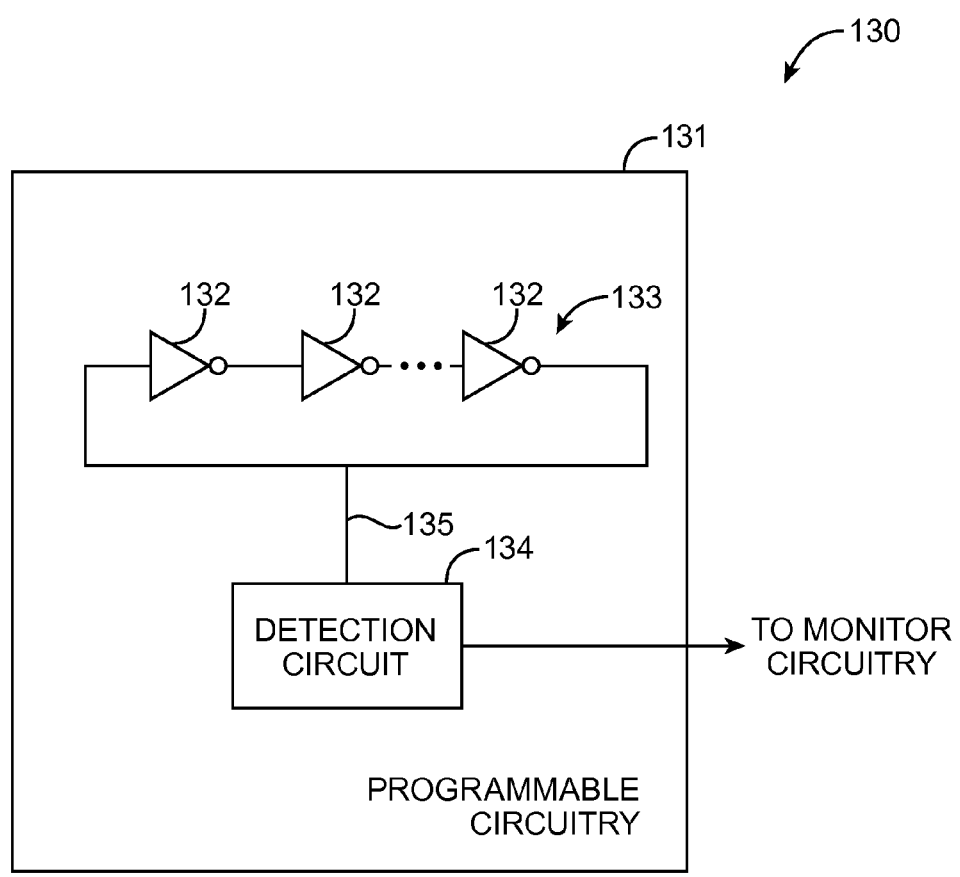
FIG. 11 is a diagram of an illustrative test configuration including a ring oscillator that may be used in testing the performance of a programmable integrated circuit in accordance with an embodiment of the present invention.
Figure 12:
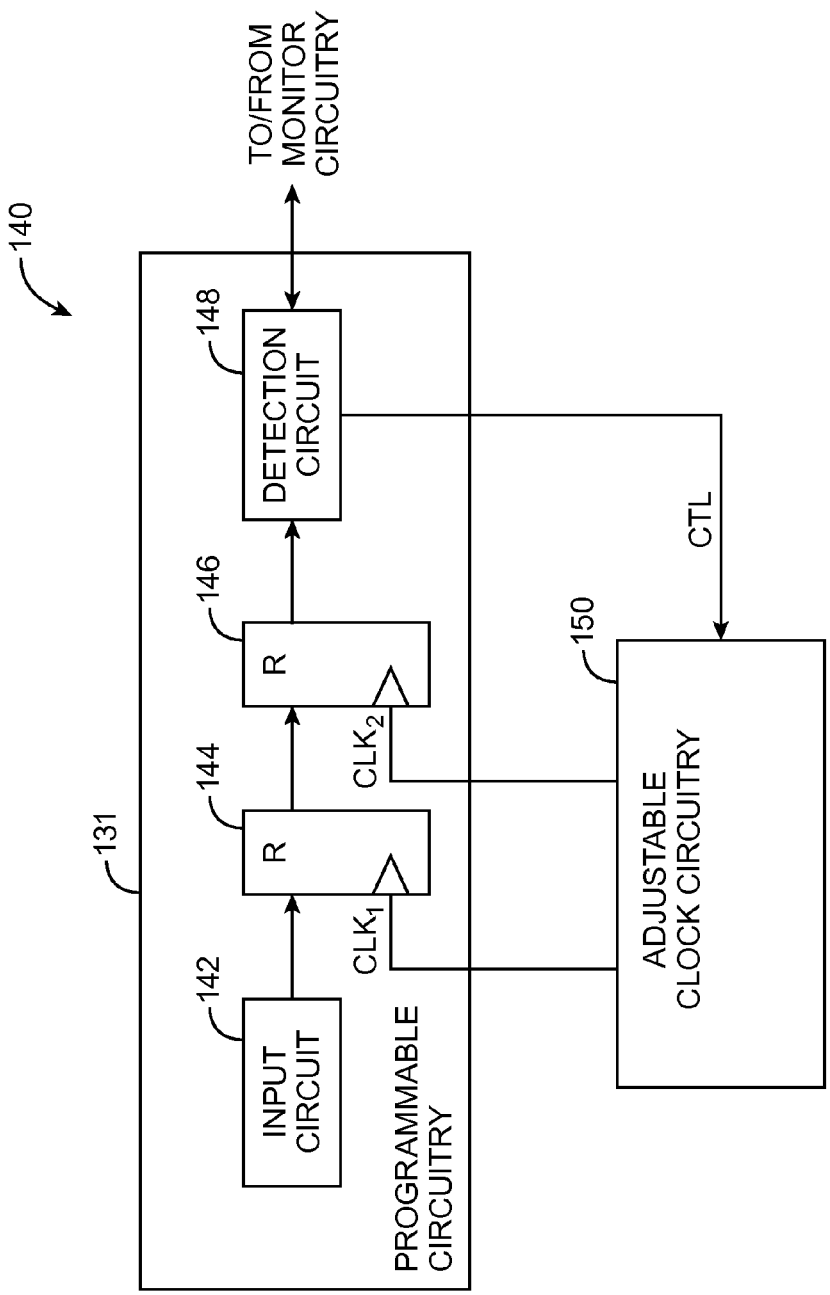
FIG. 12 is a diagram of an illustrative launch-and-capture test configuration that may be used in testing the performance of a programmable integrated circuit in accordance with an embodiment of the present invention.

FIGS. 11 and 12 are diagrams of illustrative test configurations that may be used to program portions of circuitry under test (e.g., during step 104 of flow chart 100 of FIG. 8). In the example of FIG. 11, test configuration 130 may configure programmable circuitry 131 as a ring oscillator 133 and detection circuit 134. Programmable circuitry 131 may, for example, include one or more programmable logic regions on an integrated circuit die 34 that are being tested by monitor circuitry. If desired, different portions of programmable circuitry may be programmed with copies of test configuration 130.

The output of ring oscillator 133 may be coupled to detection circuitry 134 via path 135. Ring oscillator 133 includes inverters 132. The speed at which ring oscillator 133 oscillates corresponds with the delay through inverters 132. Detection circuit 134 may include one or more registers that capture the output of ring oscillator 133 and are used in determining the oscillation frequency of ring oscillator 133. Detection circuit 134 may identify the determined oscillation frequency to monitor circuitry. Reduced oscillation frequency over time may indicate reduced performance of the programmable circuitry (e.g., transistors) that is configured to serve as inverters 132.

In the example of FIG. 12, test configuration 140 for programmable circuitry 131 may accommodate so-called launch-and-capture performance tests and may therefore be referred to as a launch-and-capture test configuration. Test configuration 140 includes input circuit 142, launch register 144, capture register 146, and detection circuit 148. If desired, intermediate logic such as combinational logic or delay circuitry may be interposed between registers 144 and 146.

During test operations, input circuit 142 provides an input data pattern (e.g., a pattern of logic one values and logic zero values) to the input of register 144. Launch register 144 may capture the input data pattern using clock signal CLK1 provided by adjustable clock circuitry 150 and provide the captured input data pattern to the input of register 146. Capture register 146 may capture the received data pattern using clock signal CLK2 provided by clock circuitry 150 and provide the captured data pattern to detection circuit 148. Detection circuit 148 may receive the captured data pattern from register 146 and determine whether the captured data pattern matches the original input data pattern provided by input circuit 142. Failure to match indicates a failed test, whereas matching data patterns indicate a successful test.

To perform tests (e.g., step 106 of flow chart 100 of FIG. 8), monitor circuitry may instruct detection circuit 148 to measure setup and hold times of the registers by adjusting the attributes of clock signals CLK1 and CLK2. For example, the phase and/or frequency of the clock signals may be incrementally adjusted until testing fails, which identifies the setup and hold time margins for the registers.

Figure 13:
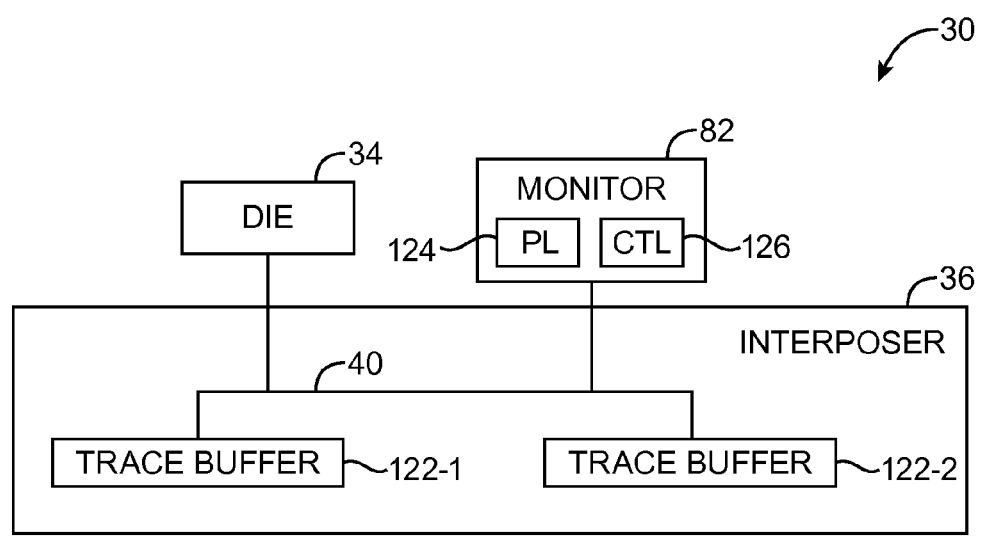
FIG. 13 is a diagram of an illustrative packaged component including trace buffers on an interposer in accordance with an embodiment of the present invention.

Active interposers that include active circuitry such as circuitry 72 of FIG. 4 may be used to store information during testing operations. FIG. 13 is an illustrative diagram of a packaged component 30 in which interposer 36 includes trace buffers 122. Trace buffers 122 may be coupled to integrated circuit die 34 and monitor circuit 82 via paths 40. Trace buffers 122 store data that is produced by integrated circuit die 34 and monitor circuit 82. Trace buffer 122-1 may store data that is produced by integrated circuit die 34, whereas trace buffer 122-2 may store data that is produced by monitor circuitry 82. Trace buffers 122 may store data temporarily. For example, stored data may be rewritten with future data produced by integrated circuit die 34 and monitor circuit 82.

The example of FIG. 13 in which two trace buffers are implemented using active circuitry on interposer 36 is merely illustrative. If desired, any desired number of trace buffers may be provided in interposer 36. For example, a trace buffer may be provided for each integrated circuit die or functional circuit block that is tested by monitor circuitry 82.

Figure 14:
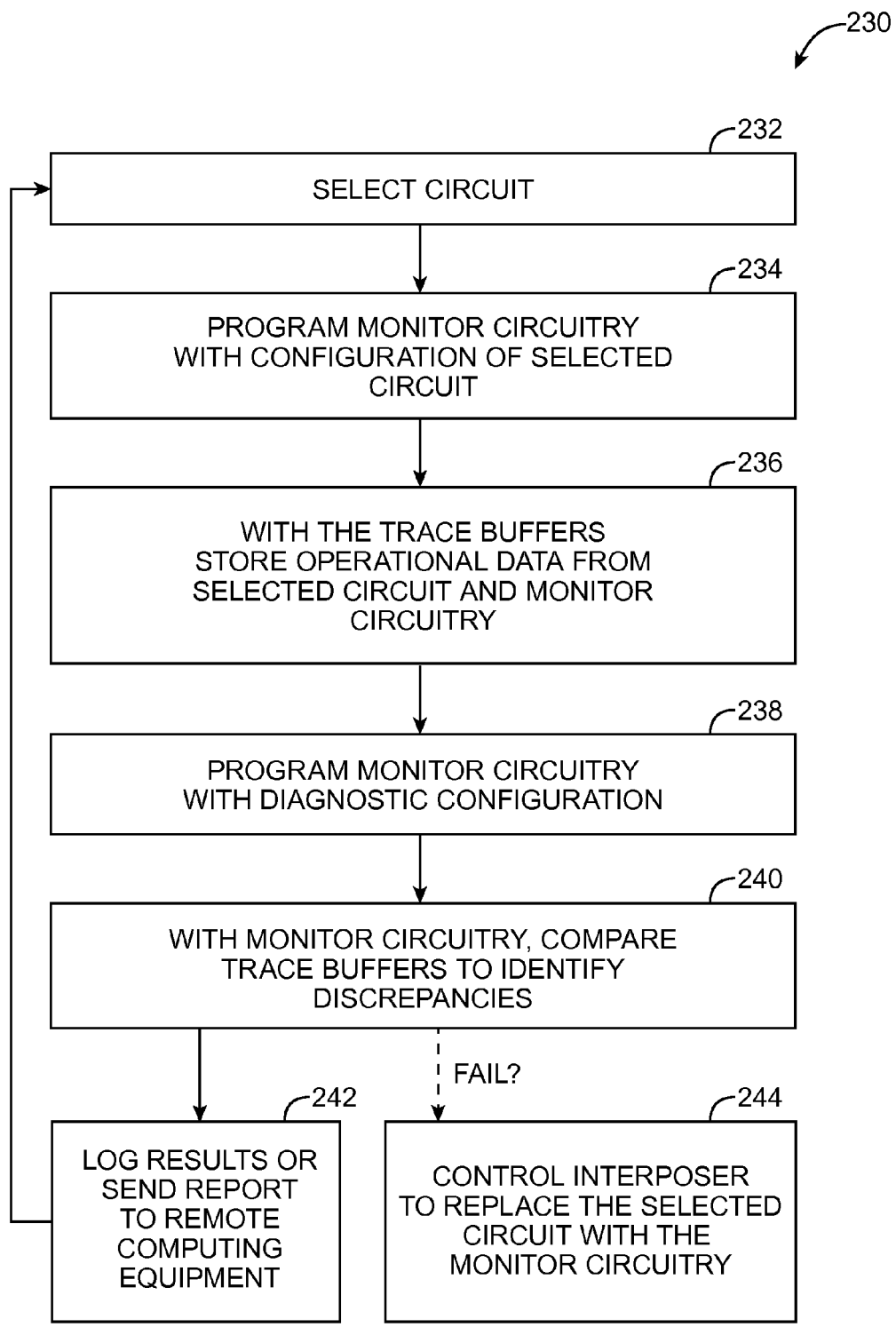
FIG. 14 is a flow chart of illustrative steps that may be performed by monitor circuitry to test circuitry using trace buffers on an interposer in accordance with an embodiment of the present invention.

Monitor circuitry 82 may include programmable circuitry 124 (e.g., programmable logic regions) and control circuitry 126. Control circuitry 126 may be a programmable logic region configured to perform control functions or may be dedicated control circuitry (as examples). Trace buffers 122 may be used during test operations to help identify operational failures of circuitry on a packaged device. FIG. 14 is a flow chart 230 of illustrative steps that may be performed using monitor circuitry and trace buffers 122 to selectively test portions of circuitry on a packaged device. For example, monitor circuitry 82 of FIG. 13 or monitor circuitry 72 of FIG. 7 may be used in performing the steps of flow chart 230.

During step 232, the monitor circuitry may select a circuit that is coupled to a trace buffer for testing. The selected circuit may be an integrated circuit die such as integrated circuit die 34 of FIG. 13 that is coupled to a corresponding trace buffer 122.

During step 234, the monitor circuitry may be programmed with the configuration of the selected circuit. For example, the configurations of circuitry on the packaged component may be stored in storage on the packaged component (e.g., flash storage or other storage circuits). In this scenario, the monitor circuitry may retrieve the configuration of the selected circuit form the storage and may configure a portion of the monitor circuitry with the selected configuration (e.g., by loading the configuration data of the retrieved configuration into programmable elements of the monitor circuitry). For example, control circuit 126 of FIG. 13 may configure programmable logic circuitry 124 with the configuration of integrated circuit die 34. If desired, the monitor circuitry may be programmed via external sources such as by server 92 of FIG. 6 (e.g., server 92 may maintain the configuration data for circuitry on the packaged component and may load the configuration data for the selected circuit into programmable elements of the monitor circuitry).

During subsequent step 236, the trace buffers may be used to store signals from the selected circuit and the monitor circuitry. Consider the scenario in which integrated circuit die 34 of FIG. 13 is selected during step 232. In this scenario, trace buffer 122-1 may be used to store output signals transmitted by integrated circuit die 34, whereas trace buffer 122-2 may be used to store output signals transmitted by monitor circuitry 82 that has been configured to perform identical functions as integrated circuit die 34.

During step 238, the monitor circuitry may be programmed with a diagnostic configuration. For example, control circuit 126 of FIG. 13 may configure programmable logic 124 with a diagnostic configuration for processing and analyzing the test results. If desired, the monitor circuitry may be programmed by an external server.

During step 240, the monitor circuitry may compare the trace buffers to determine whether the selected circuit has produced correct output data. The trace buffer containing data from the monitor circuitry may be used as reference data, because the monitor circuitry is implemented using radiation-hardened circuitry that is more reliable than the selected circuit. If desired, the monitor circuitry may be implemented using non-radiation-hardened circuitry. In a scenario in which the monitor circuitry monitors degradation over time of the selected circuit, it is not necessary for the monitor circuitry to be radiation-hardened.

During subsequent step 242, the comparison results of step 240 may be logged (e.g., stored) by the monitor circuitry or may be reported to remote computing equipment such as server 92 of FIG. 6 and the process may return to step 232 to select additional circuits for testing.

If desired, optional step 244 may be performed if the selected circuit fails testing during step 240 (e.g., if the data pattern stored in the trace buffers fail to match). During optional step 244, the monitor circuitry may control the interposer to functionally replace the selected circuit with the monitor circuitry. For example, in scenarios such as when the selected circuit is mounted on an interposer having programmable interconnects (e.g., paths 40 include programmable paths), the monitor circuitry may program the interconnects to route input and output signals of the selected circuit to the monitor circuitry. The monitor circuitry may configure a portion of itself (e.g., programmable circuitry 124 of FIG. 13) with the configuration of the selected circuit. By performing the operations of optional step 244, the monitor circuitry may help to ensure that the device continues to operate even when circuitry on the device fails.

The example of FIG. 14 in which optional step 244 is performed after step 240 is merely illustrative. If desired, monitor circuitry may control the interposer to replace any failed circuit with the monitor circuitry. For example, optional step 244 may be performed in response to identifying performance test failure during step 106 of flow chart 100 of FIG. 8.

Figure 15:
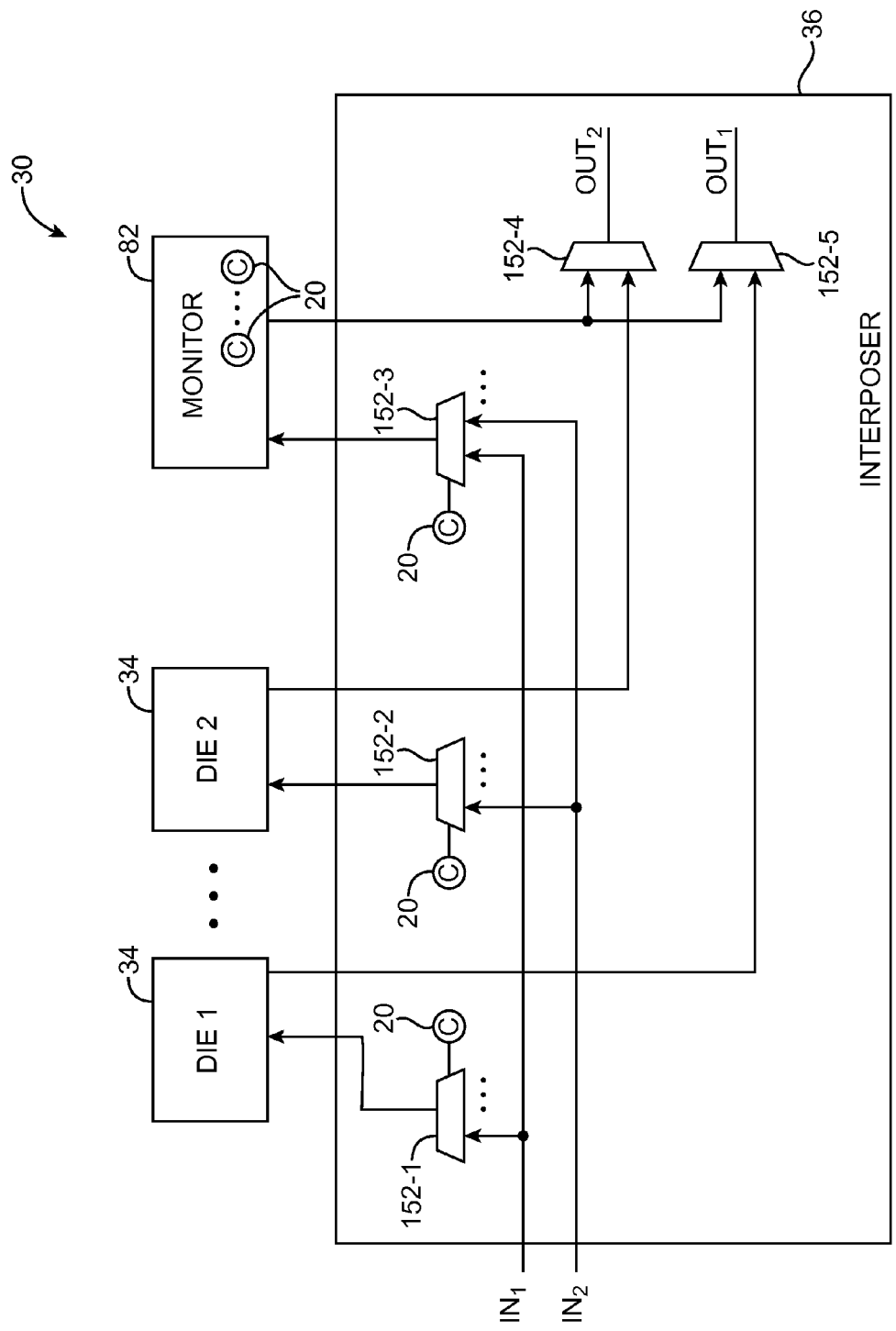
FIG. 15 is a diagram of an illustrative packaged component with an interposer having multiplexing circuitry that may be used to functionally replace selected circuitry with monitor circuitry in accordance with an embodiment of the present invention.

FIG. 15 is a block diagram of a packaged component 30 including an interposer 36 with programmable interconnects that may be configured to functionally replace a selected integrated circuit die with monitor circuitry. As shown in FIG. 15, the programmable interconnects may include multiplexers 152 (e.g., multiplexers 152-1, 152-2, 153-3, etc.).

Multiplexers 152-1 and 152-2 receive and select input signals such as input signals IN1 and IN2 for integrated circuit dies DIE1 and DIE2. Input signals IN1 and IN2 may be received from other circuitry on interposer 36 or may be received from external circuitry. If desired, input signals IN1 and IN2 may each be a set of one or more input signals routed on a corresponding set of interconnect paths (e.g., input signal IN1 may include one, two, or more input signals conveyed to multiplexer 152-1 and 152-3 on respective paths).

Multiplexer 152-3 may receive each of the input signals for integrated circuits 34 and route one or more selected input signals to monitor circuitry 82 (e.g., any input signal that may be routed to integrated circuits 34 may also be routed to monitor circuitry 82). Multiplexers 152-1, 152-2, and 152-3 may sometimes be referred to as input multiplexers, because the input multiplexers route input signals to integrated circuit dies 34 and monitor circuitry 82.

Multiplexers 152-4 and 152-5 may each be associated with a respective integrated circuit 34. Multiplexer 152-4 receives the output signal from integrated circuit DIE1 and monitor circuitry 82, whereas multiplexer 152-5 receives the output signal from integrated circuit DIE2 and monitor circuitry 82. Multiplexers 152-4 and 152-5 may be referred to as output multiplexers, because multiplexers 152-4 and 152-5 provide output signals from integrated circuits 34 and monitor circuitry 82 to other portions of interposer 36 or to external circuitry.

Input and output multiplexers of interposer 36 may be configured to replace a selected one of integrated circuit dies 34 with monitor circuitry 82 (e.g., during step 144 of FIG. 14). For example, integrated circuit DIE1 that has failed performance testing may be replaced with monitor circuitry 82 by configuring monitor circuitry 82 to perform the functions of integrated circuit DIE1, configuring multiplexer 152-3 to route input signal IN1 to monitor circuitry 82, and configuring multiplexer 152-5 to select the output signal of monitor circuitry 82 as output signal OUT1. Similarly, integrated circuit DIE2 may be replaced with monitor circuitry 82 by configuring monitor circuitry 82 and multiplexers 152-3 and 152-4 (e.g., loading configuration data into programmable elements 20).

Figure 16:
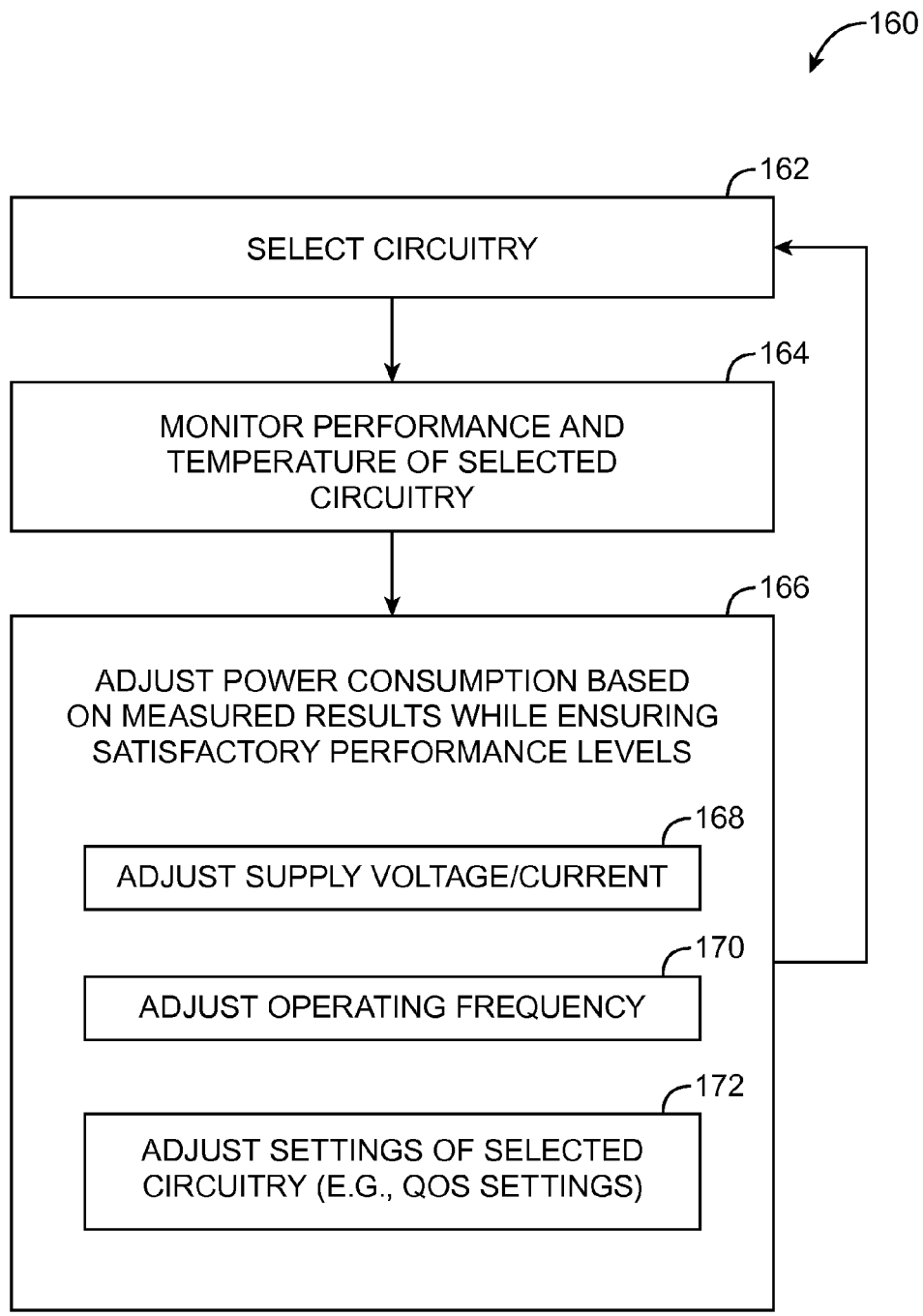
FIG. 16 is a flow chart of illustrative steps that may be performed by radiation-hardened monitor circuitry of a packaged component to adjust power consumption of selected circuitry based on monitored performance and temperature in accordance with an embodiment of the present invention.

Integrated circuit dies such as chips 34 often are subject to variances in performance and power consumption due to manufacturing tolerances. To achieve a desired performance level, each integrated circuit die may consume a corresponding amount of power that is potentially different from other integrated circuit dies. Monitor circuitry such as monitor circuitry 82 (FIG. 7) or monitor circuitry 72 (FIG. 6) that is separate from the integrated circuit dies may perform active power management to help optimize the power consumption of the integrated circuit dies. FIG. 16 is a flow chart 160 of illustrative steps that may be performed by monitor circuitry for power management of integrated circuit dies.

During the operations of step 162, the monitor circuitry may select circuitry such as an integrated circuit die for testing. During subsequent step 164, the monitor circuitry may monitor the performance and temperature of the selected circuitry. For example, steps 104 and 106 of flow chart 100 (FIG. 8) or steps 234-240 of flow chart 230 (FIG. 14) may be performed to test the performance of the selected circuitry. If desired, the performance may be identified based on statistical information such as number of Cyclic Redundancy Check (CRC) errors or bit error rate that is maintained by the monitor circuitry or by the selected circuitry. The temperature of the selected circuitry may be identified from a temperature sensor that is located near (e.g., adjacent to) or within the selected circuitry.

During step 166, the monitor circuitry may adjust the power consumption of the selected circuitry based on the measured performance and temperature results while ensuring satisfactory performance levels (e.g., while ensuring that timing constraints are met and/or ensuring that the selected circuitry passes performance tests). The power consumption may be adjusted using any desired techniques. As an example, the power that is supplied to the selected circuitry may be adjusted during step 168 (e.g., the monitor circuitry may provide a control signal to adjustable power supply circuitry that directs the power supply circuitry to supply an increased or decreased voltage or current to the selected circuitry). Power consumption may be reduced by reducing power supply voltage, current, or both. Similarly, power consumption may be increased by increasing power supply voltage and/or current. As another example, the operating frequency of the selected circuitry may be adjusted during step 170 (e.g., the monitor circuitry may provide a control signal to adjustable clock generation circuitry that directs the adjustable clock generation circuitry to increase the frequency of a clock signal provided by the clock generation circuitry to the selected circuitry to increase performance or decrease the frequency of the clock signal to reduce performance). As another example, the monitor circuitry may directly adjust settings of the selected circuitry during step 172. Settings that may be adjusted include quality of service (QoS) settings that determine data transmission settings in scenarios such as when the selected integrated circuit is a data processing circuit for data communications. Quality of service settings may define a required transmission bit rate, transmission delay, bit error rate, or other data transmission requirements for the selected circuitry.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:
    an interposer;
    a first circuit on the interposer that is characterized by a first reliability metric value; and
    a second circuit on the interposer that is characterized by a second reliability metric value that is different from the first reliability metric value, wherein the first reliability metric value comprises a first failure-in-time value and wherein the second reliability metric value comprises a second failure-in-time value.

2. The circuitry defined in claim 1 wherein the second failure-in-time value of the second circuit is less than the first failure-in-time value of the first circuit.

3. The circuitry defined in claim 2 wherein the second circuit comprises a radiation-hardened circuit.

4. The circuitry defined in claim 3 wherein the radiation-hardened circuit includes monitor circuitry that is electrically coupled to the first circuit by the interposer.

5. The circuitry defined in claim 4 wherein the first circuit comprises a first integrated circuit die that is mounted to the interposer and wherein the radiation-hardened circuit comprises a second integrated circuit die that is mounted on the interposer.

6. The circuitry defined in claim 5 wherein the second integrated circuit die comprises a programmable integrated circuit die.

7. The circuitry defined in claim 6 wherein the interposer comprises:
    an interposer substrate;
    conductive paths on the interposer substrate that convey signals for the first integrated circuit die and the monitor circuitry; and
    trace buffer circuitry on the interposer substrate that is coupled to the conductive paths, wherein the trace buffer circuitry stores the conveyed signals.

8. The circuitry defined in claim 4 wherein the interposer comprises an active interposer and wherein the radiation-hardened circuit forms part of the active interposer.

9. A packaged component, comprising:
    an interposer;
    first and second integrated circuits mounted on the interposer, wherein the second integrated circuit includes monitor circuitry that monitors the performance of the first integrated circuit; and
    at least one non-radiation-hardened integrated circuit that includes the first integrated circuit, wherein the second integrated circuit comprises a radiation-hardened integrated circuit, and wherein the interposer comprises:
        multiplexing circuitry that receives input signals for the non-radiation-hardened integrated circuit and the radiation-hardened integrated circuit and routes selected input signals to the non-radiation-hardened integrated circuit and the radiation-hardened integrated circuit.

10. The packaged component defined in claim 9 wherein radiation-hardened integrated circuit includes the monitor circuitry and wherein the at least one non-radiation-hardened integrated circuit comprises a plurality of non-radiation-hardened integrated circuit dies that are coupled to the monitor circuitry by conductive paths on the interposer.

11. The circuitry defined in claim 9 wherein the circuitry comprises network switching circuitry that receives and transmits network packets using a network protocol, wherein the non-radiation-hardened integrated circuit comprises a data processing circuit, and wherein the radiation-hardened integrated circuit comprises control circuitry that controls the data processing circuit.

12. The circuitry defined in claim 9 wherein the interposer further comprises:
    additional multiplexing circuitry that receives output signals from the non-radiation-hardened integrated circuit and the radiation-hardened integrated circuit.

13. The circuitry defined in claim 9 wherein the second integrated circuit comprises a soft-error upset (SEU) resistant integrated circuit.

14. A method of operating a packaged component including an integrated circuit mounted to an interposer, the method comprising:

with radiation-hardened monitor circuitry that is coupled to the integrated circuit, monitoring performance of the integrated circuit by:
- configuring the integrated circuit with a test configuration with the radiation-hardened monitor circuitry; and
- subsequent to configuring the integrated circuit with the test configuration, testing the performance of the integrated circuit with the radiation-hardened monitor circuitry.

15. The method defined in claim 14 wherein configuring the integrated circuit with the test configuration comprises configuring at least a portion of the integrated circuit as a ring oscillator.

16. The method defined in claim 14 wherein configuring the integrated circuit with the test configuration comprises configuring the integrated circuit with a launch-and-capture test configuration.

17. The method defined in claim 14 wherein the integrated circuit comprises programmable logic regions, wherein the integrated circuit has a configuration that utilizes a first portion of the programmable logic regions, the method further comprising:

in response to determining that the integrated circuit fails testing, configuring the integrated circuit with an alternate configuration that utilizes a second portion of the programmable logic regions that is different from the first portion of the programmable logic regions.

18. The method defined in claim 14, wherein monitoring the performance of the integrated circuit comprises:
- with a first trace buffer on the interposer, storing output signals from the integrated circuit;
- with a second trace buffer on the interposer, storing output signals from the monitor circuitry; and
- with the monitor circuitry, comparing the stored output signals of the first and second trace buffers.

19. The method defined in claim 14 further comprising:
- with the radiation-hardened monitor circuitry, monitoring temperature of the integrated circuit; and
- adjusting power consumption of the integrated circuit based on the monitored temperature and the monitored performance.

* * * * *